United States Patent [19]

Pelley, III

[11] Patent Number: 5,760,626

[45] Date of Patent: Jun. 2, 1998

[54] BICMOS LATCH CIRCUIT FOR LATCHING DIFFERENTIAL SIGNALS

[75] Inventor: Perry H. Pelley, III, Austin, Tex.

[73] Assignee: Motorola Inc., Schaumburg, Ill.

[21] Appl. No.: 626,703

[22] Filed: Apr. 1, 1996

[51] Int. Cl.[6] .................................................. H03K 3/12

[52] U.S. Cl. ........................ 327/207; 327/55; 327/200; 327/223

[58] Field of Search ........................ 327/52, 54, 55, 327/57, 199–225; 365/189.05, 189.06, 189.07, 195, 196, 205

[56] References Cited

U.S. PATENT DOCUMENTS

| 4,644,185 | 2/1987 | Todd | 327/208 |
|---|---|---|---|
| 4,792,923 | 12/1988 | Nakase et al. | 327/199 |
| 4,825,100 | 4/1989 | Caspell | 327/208 |
| 4,831,287 | 5/1989 | Golab | 327/55 |
| 5,079,452 | 1/1992 | Lain et al. | 327/223 |
| 5,140,199 | 8/1992 | Seo | 327/57 |
| 5,343,428 | 8/1994 | Pilo et al. | 365/189.05 |

FOREIGN PATENT DOCUMENTS

| 2-19016 | 1/1990 | Japan | 327/199 |

Primary Examiner—Kenneth B. Wells

[57] ABSTRACT

A data value is passed from a bus (50) to a receiver (40) without a propagation delay. A data latch (10) stores the data value while the data value is being generated by the bus (50). The data latch (10) then holds the data value and provides the data value to the receiver (40) after the data value is no longer present on the bus (50). The data latch (10) has a data storage circuit (11), a diode clamping circuit (12), and a current sourcing circuit (13). The data value is stored by the data storage circuit (11) by a feed-back loop circuit.

10 Claims, 1 Drawing Sheet 5,760,626

1

BICMOS LATCH CIRCUIT FOR LATCHING DIFFERENTIAL SIGNALS

BACKGROUND OF THE INVENTION

This invention relates, in general, to data latching circuits, and more particularly, to a data latch circuit used in conjunction with a data bus.

In most integrated circuits, a bus is used to pass data to various modules and sub-circuits. The bus is also used to pass data to external data pins. To pass data to an output pin, the data value is traditionally passed from the bus through a data receiver. The data value is then amplified and passed to the output pin. Conventional latch circuits are sometimes necessary to store the data value from the bus after the bus is no longer actively driven. The latch circuit then holds the data value so that the data value can be present on the output pin for the necessary period of time, commonly referred to as hold time. The latch circuit allows the state of the bus to change, but the data value on the output pin will be held to the value stored in the data latch.

One problem with using a data latch between a bus and a data receiver is that there is a delay from the time the data value is on the bus to the time the data value is present on the output pin. This delay is due in part to the time it takes for the data value to pass through the latch from the bus on its way to the data receiver. This delay is commonly referred to as a propagation delay and contributes to the speed at which the integrated circuit can operate. Contrary to the desire to improve the operating speed of integrated circuits, this propagation delay can significantly limit the performance of an integrated circuit.

Accordingly, it should be appreciated that it would be advantageous to provide a latching circuit that does not generate a propagation delay when a data value is passed from a bus to a data receiver such as an amplifier.

DETAILED DESCRIPTION OF THE DRAWINGS

Generally, the present invention provides a data latching circuit that can be used to store data from a data bus. The latching circuit stores a data value from the bus so that it can be outputted after the bus is no longer actively driven. The configuration of the latching circuit is such that the data value is passed from the bus to the data receiver as soon as the data value is present on the bus. In other words, the latching circuit does not generate a propagation delay to store the data value in a data latch.

Figure 1:
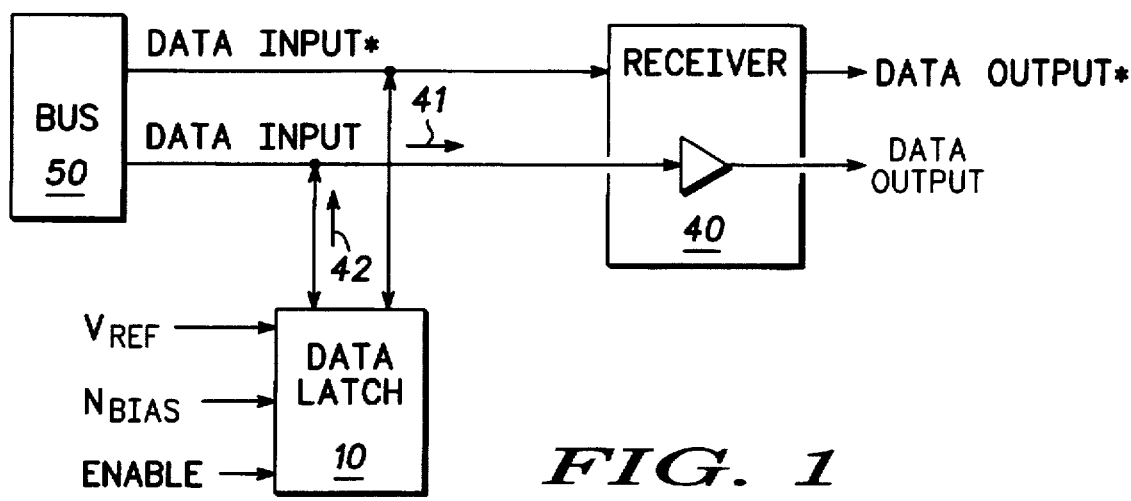
FIG. 1 is a block diagram of an implementation of a latching circuit in accordance with the present invention.

Turning now to FIG. 1, an overview of the operation of the latching circuit of the present invention will be provided. In general, the latching circuit is arranged so that a DATA INPUT signal is passed directly from a bus 50 to a receiver 40. Bus 50 is generally meant to represent a source of a data signal such as a traditional bus used by a circuit to pass data to various points in the circuit. Bus 50 could also be the output of a circuit such as the output of an inverter, a NAND gate, or the like. Receiver 40 is generally meant to represent any circuit element that processes the DATA INPUT signal from bus 50 such as an amplifier for an output pin. Receiver 40 then acquires the DATA INPUT signal and passes the

2 amplified value as a DATA OUTPUT signal. A data latch 10 is configured to be in parallel so data latch 10 stores the DATA INPUT signal and holds the value for receiver 40 when the DATA INPUT signal is absent or no longer provided by bus 50. In addition to the DATA INPUT signal, data latch 10 has three other input signals. These signals are a $V_{REF}$, which is used as a reference voltage such as VDD, $N_{BIAS}$, which is used to bias or regulate the current used by data latch 10, and an ENABLE signal, which is used by data latch 10 to indicate when the DATA INPUT signal is to be stored. Also shown in FIG. 1 is a DATA INPUT* signal, which is the logical complement of the DATA INPUT signal and is commonly used in busing schemes. In the following discussion, an asterisk (*) indicates that a signal is the logical complement of a signal having the same name but lacking the asterisk (*). Receiver 40 also generates a data value called DATA OUTPUT*, which is the logical complement of DATA OUTPUT.

Figure 2:
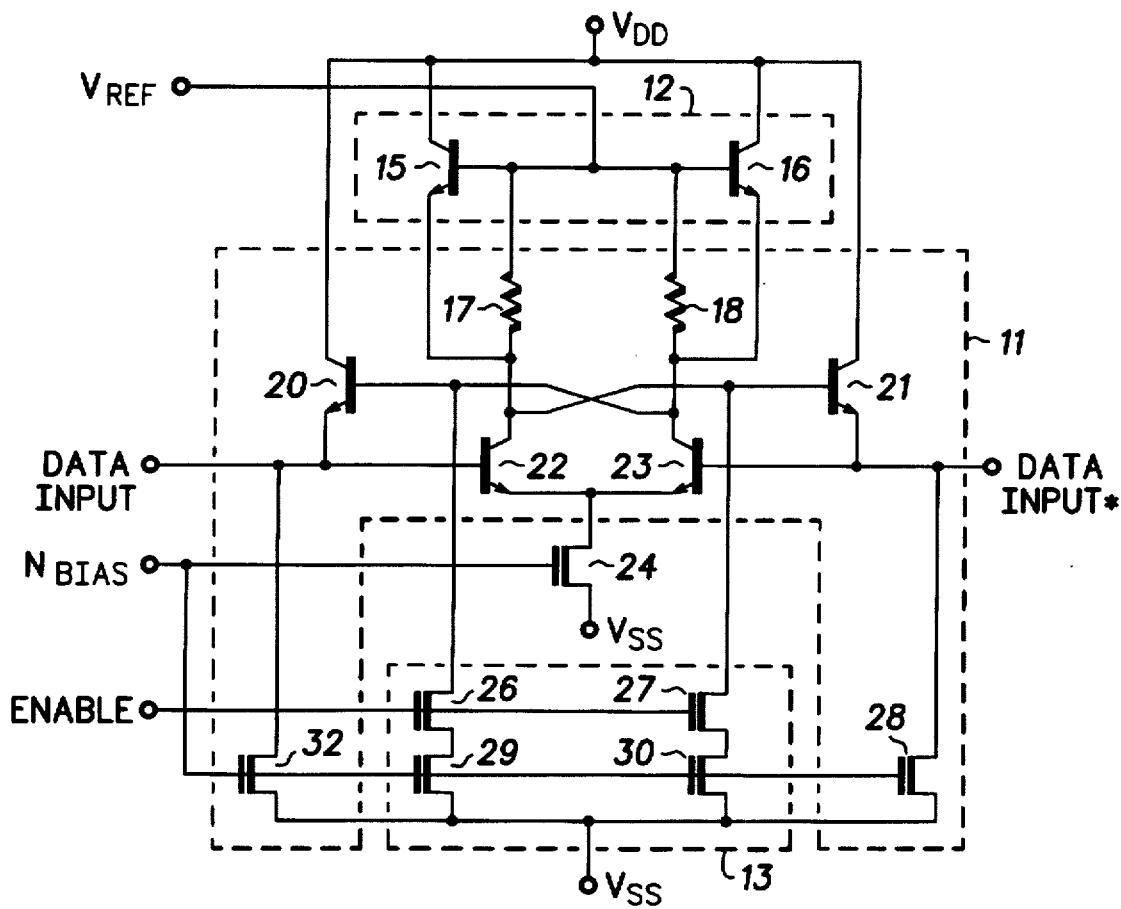
FIG. 2 is a schematic of a data latch according to the present invention.

The present invention can be more fully described with reference to FIG. 2. FIG. 2 is a schematic of data latch 10 of FIG. 1. As shown in FIG. 2, data latch 10 has complementary terminals labeled DATA INPUT and DATA INPUT* which provide data to the bases of transistors 22 and 23 respectively. In turn, the terminals can be driven by the emitters of transistors 20 and 21 respectively. Therefore, the path 42 illustrated in FIG. 1 represents the portion of the complementary data input signals that are driven by the emitters of transistors 20 and 21. The same is true for the connections for the DATA INPUT* signal. As will be described in more detail below, at different times in the operation of data latch 10, bus 50 is responsible for generating the DATA INPUT signal, and at other times data latch 10 is responsible for providing the DATA INPUT signal. Data latch 10 comprises three sub-circuits: a data storage circuit 11, a diode clamping circuit 12, and a current sourcing circuit 13.

Data storage circuit 11 is a feed-back circuit that uses the voltage values of the DATA INPUT signal and the DATA INPUT* signal and stores these values when data latch 10 is enabled. The values of the DATA INPUT signal and the DATA INPUT* signal drive bipolar NPN transistors 20, 21, 22, and 23, which in turn reinforce or support the voltage values of the DATA INPUT signal and the DATA INPUT* signal when ENABLE is low. Resistors 17 and 18 comprise the load for data storage circuit 11. Transistor 24, for example, is a MOS (metal-oxide semiconductor) N-channel transistor that sets the current shared by transistors 22 and 23 of data storage circuit 11. MOS N-channel transistors 28 and 32 comprise part of the load of bus 50 and bias the emitters of transistors 20 and 21.

Diode clamping circuit 12 comprises bipolar NPN transistors 15 and 16. Diode clamping circuit 12 is used to ensure that the voltage values of the DATA INPUT signal or the DATA INPUT* signal do not drop below a predetermined voltage and saturate transistors 22 or 23.

Current sourcing circuit 13 comprises MOS N-channel transistors 26, 27, 29 and 30. Current sourcing circuit 13 provides the current to disengage data latch 10 from bus 50 and uses the input signal ENABLE to control the state and operation of data storage circuit 11.

A detailed description of the elements shown in FIG. 2 will now be provided with a discussion of how the elements are electrically connected to one another. NPN transistor 15 has a collector connected to a first power supply voltage terminal labeled "$V_{DD}$", a base for receiving reference voltage $V_{REF}$, and an emitter. NPN transistor 16 has a collector connected to the first power supply voltage, a base for receiving reference voltage $V_{REF}$, and an emitter. Resistor 17 has a first terminal connected to the base of NPN transistor 15 and a second terminal connected to the emitter of NPN transistor 15. Resistor 18 has a first terminal connected to the base of NPN transistor 16 and a second terminal connected to the emitter of NPN transistor 16.

NPN transistor 20 has a collector connected to the first power supply voltage, a base connected to the second terminal of resistor 18, and an emitter for receiving and providing the DATA INPUT signal. NPN transistor 21 has a collector connected to the first power supply voltage, a base connected to the second terminal of resistor 17, and an emitter for receiving and providing the DATA INPUT* signal. NPN transistor 22 has a collector connected to the second terminal of resistor 17, a base for receiving the DATA INPUT signal, and an emitter. NPN transistor 23 has a collector connected to the second terminal of resistor 18, a base for receiving the DATA INPUT* signal, and an emitter.

N-channel transistor 24 has a drain connected to the emitter of NPN transistor 22 and the emitter of NPN transistor 23, a gate for receiving the signal $N_{BIAS}$, and a source connected to a second power supply voltage terminal labeled "$V_{SS}$". N-channel transistor 26 has a drain connected to the base of NPN transistor 20, a gate for receiving the signal ENABLE, and a source. N-channel transistor 27 has a drain connected to the base of NPN transistor 21, a gate for receiving the signal ENABLE, and a source. N-channel transistor 32 has a drain connected to the DATA INPUT signal, a gate for receiving the signal $N_{BIAS}$, and a source connected to the second power supply voltage. N-channel transistor 29 has a drain connected to the source of N-channel transistor 26, a gate for receiving the signal $N_{BIAS}$, and a source connected to the second power supply voltage. N-channel transistor 30 has a drain connected to the source of N-channel transistor 27, a gate for receiving the signal $N_{BIAS}$, and a source connected to the second power supply voltage. N-channel transistor 28 has a drain connected to the signal DATA INPUT*, a gate for receiving the signal $N_{BIAS}$, and a source connected to the second power supply voltage.

A method of use will now be provided to demonstrate how the elements of data latch 10 interact to latch a data value and do so substantially without a propagation delay. The first power supply voltage is set to around 3.5 volts and the second power supply voltage is set to ground. $V_{REF}$ sets the maximum voltage on the collectors of NPN transistors 22 and 23, and enables diode clamping circuit 12. Preferably, $V_{REF}$ is set to a first reference voltage of about 3.5 volts or slightly less than 3.5 volts. The first reference voltage is selected such that the signal coupled to bus 50 by the emitters of NPN transistors 20 and 21 is biased to correctly interface with bus 50. Resistors 17 and 18 and current source N-channel transistor 24 are selected such that a signal swing of about 0.7 volts can occur at the collectors of NPN transistors 22 and 23. NPN transistors 20 and 21 act as voltage clamps to prevent the collectors of NPN transistors 23 and 22 from saturating. $N_{bias}$ is set to a second reference voltage such that N-channel transistors 24, 28, 29, 30, 32 are constant current sources. The current of transistor 24 determines the amount of current that transistors 22 and 23 can pass to resistors 17 and 18. Resistors 17 and 18 set the signal size coupled from the collectors of transistors 22 and 23 to bus 50 via transistors 20 and 21. N-channel transistors 32 and 28 comprise part of the load for bus 50.

Depending on the voltage level or logical value of the signal ENABLE, data latch 10 will perform one of two functions. The first of these functions is if the ENABLE signal is active. Active generally meaning that the state of the ENABLE signal is changed to trigger the desired response from data latch 10. In this state, data storage circuit 11 does not drive the values of the DATA INPUT signal and the DATA INPUT* signal so that the values of the DATA INPUT signal and the DATA INPUT* signal are driven by an external source such as bus 50 of FIG. 1. This path is shown in FIG. 1 as path 41.

The second function of data latch 10 occurs when the ENABLE signal is inactive. In this state, the voltage levels of the DATA INPUT signal and the DATA INPUT* signal will enable the elements of data storage circuit 11 so that data latch 10 will drive the values of the DATA INPUT signal and the DATA INPUT* signal. Therefore, data latch 10 can provide the values of the DATA INPUT signal and the DATA INPUT* signal to receiver 40 as shown in FIG. 1 by path 42.

A more detailed description of how data latch 10 operates when the ENABLE signal is active or inactive will now be provided. An active voltage potential from the signal ENABLE will turn on N-channel transistors 26 and 27. This will cause N-channel transistors 29 and 30 to sink a current flow so that the base current of NPN transistors 20 and 21 will be pulled down, turning off transistors 20 and 21. This in turn will prevent the emitters of NPN transistors 20 and 21 from changing the voltage potential of the signals DATA INPUT and DATA INPUT* respectively. Referring now to FIG. 1, when the signal ENABLE is active, the values of the DATA INPUT signal and the DATA INPUT* signal are passed directly to receiver 40 without any propagation delay.

In the operation of many memory devices there is a need to hold the data value on an output pin, such as receiver 40, for a period of time after the data value is no longer driven by bus 50. This is one of the possible uses of data latch 10. In FIG. 1, as the DATA INPUT signal and the DATA INPUT* signal are passed to receiver 40, data latch 10 stores the particular data values so that they are available to receiver 40 for the necessary hold time.

The storing and holding of the DATA INPUT signal and the DATA INPUT* signal occurs as the signal ENABLE transitions from active to inactive. Referring now to FIG. 2, as ENABLE becomes inactive, current sourcing circuit 13 is disabled which allows a current to flow into the base of NPN transistors 20 and 21. In this example, the DATA INPUT signal is an active value and thus the DATA INPUT* signal is an inactive value. The DATA INPUT signal at an active value will enable NPN transistor 22 so that current will flow from the collector to the emitter of NPN transistor 22. The amount of current is determined by N-channel transistor 24. The current flow through NPN transistor 22 will also sink any current that would flow into the base of NPN transistor 21. This will disable NPN transistor 21 so that the voltage level of the DATA INPUT* signal is not affected by NPN transistor 21. The DATA INPUT* signal at an inactive value will disable NPN transistor 23 so that there is no current flow from the collector to the emitter of NPN transistor 23. There will be a current flow into the base of NPN transistor 20 via resistor 18, which will enable NPN transistor 20. The amount of current is determined by the current load on the DATA INPUT signal. The current flow through NPN transistor 20 will raise the voltage level of the DATA INPUT signal and keep the DATA INPUT signal in an active state.

Data storage circuit 11 uses a feed-back loop design to store or support the values of the DATA INPUT signal and the DATA INPUT* signal. Referring now to FIG. 1, if the DATA INPUT signal and the DATA INPUT* signal are provided by bus 50, the values will be passed directly from bus 50 to receiver 40 as shown by path 41. During this time, data latch 10 stores the values of the DATA INPUT signal and the DATA INPUT* signal in the feed-back loop of data storage circuit 11 of FIG. 2. Therefore, when the values of the DATA INPUT signal and the DATA INPUT* signal are no longer provided by bus 50, they are provided by data latch 10 shown as path 42 of FIG. 1. The amount of time that data latch 10 holds the values of the DATA INPUT signal and the DATA INPUT* signal is determined by the state of the signal ENABLE. Once the values of the DATA INPUT signal and the DATA INPUT* signal have been provided to receiver 40 for the necessary hold time, the signal ENABLE becomes active and data latch 10 stops providing the values of the DATA INPUT signal and the DATA INPUT* signal.

By now it should be appreciated that the present invention provides a data latching circuit for the storing of a data value in a data latch. As implemented in the above examples, the data latch does not generate any propagation delays for the transmission of the data value. The data latch of the present invention can also be used to hold a data value for a predetermined period of time as required by the integrated circuit that the data latch is used in.

I claim:

1. A data latch having differential input terminals for receiving differential input signals from a bus, the data latch comprising:

a device having a PN junction coupled to a first reference voltage terminal, wherein the device is for controlling a voltage potential on the differential input terminals and comprises:

a first bipolar transistor having a first current electrode coupled to a first power supply terminal, a second current electrode coupled to a first one of the differential input terminals, and a control electrode;

a second bipolar transistor having a first current electrode coupled to the first power supply terminal, a second current electrode coupled to the other of the differential input terminals, and a control electrode;

a third bipolar transistor having a first current electrode coupled to the first power supply terminal, a second current electrode coupled to the control electrode of the second bipolar transistor, and a control electrode coupled to the first reference voltage terminal; and a fourth bipolar transistor having a first current electrode coupled to the first power supply terminal, a second current electrode coupled to the control electrode of the first bipolar transistor, and a control electrode coupled to the first reference voltage terminal;

the data latch further comprising:

a current sourcing circuit coupled to the device, wherein the current sourcing circuit controls a current flow in the data latch; and a data storage circuit coupled to the device, the current sourcing circuit, and the differential input terminals, for storing the differential input signals; and wherein, the differential input signals pass from the differential input terminals through the data storage circuit to the bus when an enable signal is in a first state, and the stored differential input signals are provided to the bus by the data latch when the enable signal is in a second state.

2. The data latch of claim 1 wherein the current sourcing circuit comprises:

a first transistor having a first current electrode, a second current electrode, and a control electrode coupled for receiving the enable signal;

a second transistor having a first current electrode coupled to the second current electrode of the first transistor, a second current electrode coupled to a second power supply terminal, and a control electrode coupled to a second reference voltage terminal;

a third transistor having a first current electrode, a second current electrode, and a control electrode coupled for receiving the enable signal; and a fourth transistor having a first current electrode coupled to the second current electrode of the third transistor, a second current electrode coupled to the second power supply terminal, and a control electrode coupled to the second reference voltage terminal.

3. The data latch of claim 1 wherein the current sourcing circuit receives a biasing signal for controlling an amount of current used by the data storage circuit.

4. A data latch having differential input terminals for receiving differential input signals from a bus, the data latch comprising:

a device having a PN junction coupled to a first reference voltage terminal, wherein the device is for controlling a voltage potential on the differential input terminals;

a current sourcing circuit coupled to the device, wherein the current sourcing circuit controls a current flow in the data latch;

a data storage circuit coupled to the device, the current sourcing circuit, and the differential input terminals, for storing the differential input signals, the data storage circuit comprising:

a first bipolar transistor having a first current electrode coupled to a first power supply terminal, a second current electrode coupled to a first one of the differential input terminals, and a control electrode;

a second bipolar transistor having a first current electrode coupled to the first power supply terminal, a second current electrode coupled to the other of the differential input terminals, and a control electrode;

a third bipolar transistor having a first current electrode coupled to the control electrode of the second bipolar transistor, a control electrode coupled to the first one of the differential input terminals, and a second current electrode;

a fourth bipolar transistor having a first current electrode coupled to the control electrode of the first bipolar transistor, a control electrode coupled to the other of the differential input terminals, and a second current electrode coupled to the second current electrode of the third bipolar transistor;

a first resistor having a first terminal coupled to the first reference voltage terminal and a second terminal coupled to the control electrode of the first bipolar transistor;

a second resistor having a first terminal coupled to the first reference voltage terminal and a second terminal coupled to the control electrode of the second bipolar transistor;

a first transistor having a first current electrode coupled to the first one of the differential input terminals, a second current electrode coupled to a second power supply terminal, and a control electrode coupled to a second reference voltage terminal; and a second transistor having a first current electrode coupled to the other of the differential input terminals, a second current electrode coupled to the second power supply terminal, and a control electrode coupled to the second reference voltage terminal.

5. The data latch of claim 4 wherein the data storage circuit comprises a third transistor having a first current electrode coupled to the second current electrode of the third bipolar transistor and to the second current electrode of the fourth bipolar transistor, a second current electrode coupled to the second power supply terminal, and a control electrode coupled to the second reference voltage terminal.

6. The data latch of claim 4 further comprising:

a fifth bipolar transistor having a first current electrode coupled to the first power supply terminal, a second current electrode coupled to the control electrode of the second bipolar transistor, and the control electrode coupled to a first reference voltage terminal; and a sixth bipolar transistor having a first current electrode coupled to the first power supply terminal, a second current electrode coupled to the control electrode of the first bipolar transistor, and a control electrode coupled to the first reference voltage terminal.

7. The data latch of claim 4, wherein the first transistor and the second transistor are metal-oxide semiconductor transistors.

8. A latch for storing a data value from a bus, and for receiving a first reference voltage signal, a second reference voltage signal, and an enable signal, wherein the enable signal, when in a first state, disables the latch so that the latch is not providing the data value to the bus and the enable signal, when in a second state, enables the latch so that the data value is stored in the latch and provides the stored data value to the bus, and the latch comprises a diode clamping circuit comprising:

a first bipolar transistor having a first current electrode coupled to a first power supply terminal, a second current electrode, and a control electrode for receiving the first reference voltage signal; and a second bipolar transistor having a first current electrode coupled to the first power supply terminal, a second current electrode, and a control electrode coupled to the control electrode of the first bipolar transistor.

9. A latch, having differential input terminals, for storing a data value from a bus, and for receiving a first reference voltage signal, a second reference voltage signal, and an enable signal, wherein the enable signal, when in a first state, disables the latch so that the latch is not providing the data value to the bus and the enable signal, when in a second state, enables the latch so that the data value is stored in the latch and provides the stored data value to the bus, wherein the latch comprises a data storage circuit which includes:

a first bipolar transistor having a first current electrode coupled to a first power supply terminal, a second current electrode coupled to a first one of the differential input terminals, and a control electrode;

a second bipolar transistor having a first current electrode coupled to the first power supply terminal, a second current electrode coupled to the other of the differential input terminals, and a control electrode;

a third bipolar transistor having a first current electrode coupled to the control electrode of the second bipolar transistor, a control electrode coupled to the first one of the differential input terminals, and a second current electrode;

a fourth bipolar transistor having a first current electrode coupled to the control electrode of the first bipolar transistor, a control electrode coupled to the other of the differential input terminals, and a second current electrode coupled to the second current electrode of the third bipolar transistor;

a first resistor having a first terminal coupled to receive the first reference voltage signal and a second terminal coupled to the control electrode of the first bipolar transistor;

a second resistor having a first terminal coupled to receive the first reference voltage signal and a second terminal coupled to the control electrode of the second bipolar transistor;

a first transistor having a first current electrode coupled to the first one of the differential input terminals, a second current electrode coupled to a second power supply terminal, and a control electrode coupled to receive the second reference voltage signal; and a second transistor having a first current electrode coupled to the other of the differential input terminals, a second current electrode coupled to the second power supply terminal, and a control electrode coupled to the second reference voltage signal.

10. The data latch of claim 9, wherein the first transistor and the second transistor are metal-oxide semiconductor transistors.

* * * * *